(12) United States Patent
Ku et al.

(10) Patent No.: US 7,336,061 B2
(45) Date of Patent: Feb. 26, 2008

(54) GROUP WIRING SYSTEM ALLOWING LOCATING OF WIRE PAIRS AND METHOD FOR LOCATING WIRE PAIRS IN GROUP WIRING SYSTEM

(75) Inventors: Ying-Ming Ku, Taoyuan (TW); Yi-Huang Lee, Dayuan Township, Taoyuan County (TW); Tien-Chi Tseng, Siaying Township, Tainan County (TW)

(73) Assignee: YFC-Boneagle Electric Co., Ltd., Taoyuan (TW)

( * ) Notice: Subject to any disclaimer, the term of this patent is extended or adjusted under 35 U.S.C. 154(b) by 0 days.

(21) Appl. No.: 11/404,728

(22) Filed: Apr. 14, 2006

(65) Prior Publication Data

US 2007/0241757 A1 Oct. 18, 2007

(51) Int. Cl.
*G01R 19/00* (2006.01)
*H04M 1/24* (2006.01)

(52) U.S. Cl. .......................... 324/66; 324/542; 379/25; 379/29.01

(58) Field of Classification Search ................ 324/542, 324/537, 66
See application file for complete search history.

(56) References Cited

U.S. PATENT DOCUMENTS

| | | | |
|---|---|---|---|
| 4,575,588 A | 3/1986 | Vyver ......................... 379/22 |
| 4,626,633 A | 12/1986 | Ruehl et al. .............. 379/27.08 |
| 5,512,819 A * | 4/1996 | Boudreaux ................... 324/66 |
| 5,764,725 A | 6/1998 | Martin et al. ............ 379/22.07 |
| 5,847,557 A | 12/1998 | Fincher et al. ................. 324/66 |
| 6,039,732 A | 3/2000 | Ichikawa et al. ............. 606/38 |
| 6,750,643 B2 * | 6/2004 | Hwang et al. ................. 324/66 |
| 6,900,629 B2 | 5/2005 | Hwang et al. ............ 324/158.1 |

* cited by examiner

*Primary Examiner*—Anjan Deb
*Assistant Examiner*—John Zhu
(74) *Attorney, Agent, or Firm*—Alan Kamrath; Kamrath & Associates PA

(57) ABSTRACT

A group wiring system includes a hub of a server system, a distribution frame including a plurality of wire pair receptacles, a plurality of remote receptacles, a testing device, and a plurality of testing circuits. Each testing circuit is coupled between conductive wires of contacts of an associated wire pair receptacle. Each testing circuit includes a light emitting device and a filtering device. The light emitting device emits light when the testing device applies a testing voltage to the contacts. The testing voltage is a low-frequency voltage signal having a frequency higher than 200 Hz that creates a circuit impedance higher than an impedance of the filtering device when passing through the hub, thereby decaying and filtering the voltage signal and allowing locating test while the server system is on-line. A method for locating wire pairs in a group wiring system is also disclosed.

4 Claims, 4 Drawing Sheets

GROUP WIRING SYSTEM ALLOWING LOCATING OF WIRE PAIRS AND METHOD FOR LOCATING WIRE PAIRS IN GROUP WIRING SYSTEM

FIELD OF THE INVENTION

The present invention relates to a group wiring system allowing locating of wire pairs. The present invention also relates to a method for locating wire pairs in a group wiring system.

BACKGROUND OF THE INVENTION

A typical communication system usually involves hundreds or even thousands of end users located at different sites or places sharing the service provided by the same server system. Some end users may connect to the server system from the internet through modems. Some end users may connect to the server system via local servers which may be far away from the server system. Some end users may connect to the server system by using hubs which may be located in the same building but different floors of the server system. Some end users may connect to the server system through a jack or socket near their working tables. Some end users may use wireless networking devices and wireless hubs to access the server system. Thousands of wires coming from different locations are gathered and connected to a distribution frame such as a patch panel stack. Management of the wires (or cables), e.g., identifying which jack on the patch panel is connected to which end user located at what remote location, is thus a critical issue in such a large server system.

Conventional methods for wire pair identification are labor-intensive and time-consuming. The network jack in the working area could not be rapidly located to the associated network receptacle, leading to troublesome locating of the wire pairs. U.S. Pat. No. 6,750,643 assigned to the Assignee of the present application discloses a group wiring patching system and a method for wire pair identification. The group wiring patching system comprises a testing device and a group wiring patch device that has built-in light emitting means and filtering means coupled with wire pair receptacles. When a testing voltage is applied to the circuit of the light emitting means, the light emitting means will emit light for assisting wire pair identification. The filtering means can minimize or even eliminate loop back shorting resulted by the circuit of the connected light emitting means when communication frequency signals or low voltage signals are applied thereto. Therefore, the group wiring patching device is able to perform ordinary signal transmitting functions without the need to remove the light emitting means after the wire pair identification process is done.

However, when the wiring procedure is completed (i.e., connection to servers is completed), relocating the wire pairs of the wiring system would cause short circuit, as the voltage of the testing signals is a voltage of low direct current that will result in low impedance of the circuits for the electric components in the servers. Hence, the light emitting means built in the group wiring system could not function. As a result, relocating of the wire pairs of the wiring system requires removal of all of the server connection, which is labor-intensive and time-consuming.

SUMMARY OF THE INVENTION

An objective of the present invention is to provide a group wiring system that allows locating of wire pairs while a server system is on-line.

Another objective of the present invention is to provide a method for locating wire pairs in a group wiring system while a server system is on-line.

Detachment of the server system before the procedure for locating the wire pairs is not required. The operational efficiency is improved, and the labor and time are saved.

In accordance with a first aspect of the present invention, a group wiring system comprises a hub of a server system, a distribution frame electrically connected to the hub, the distribution frame including a plurality of wire pair receptacles, each wire pair receptacle including at least two contacts each connecting with a conductive wire, a plurality of remote receptacles electrically connected to the distribution frame and respectively in association with the wire pair receptacles of the distribution frame, a testing device electrically connected to the remote receptacles, and a plurality of testing circuits. Each testing circuit is coupled between the conductive wires of the contacts of an associated one of the wire pair receptacles. Each testing circuit comprises a light emitting means and a filtering means.

The light emitting means emit light when the testing device applies a testing voltage to the contacts. The testing voltage is a low-frequency voltage signal having a frequency higher than 200 Hz that creates a circuit impedance higher than an impedance of the filtering means when passing through the hub, thereby decaying and filtering the low-frequency voltage signal and allowing locating test while the server system is on-line.

In accordance with a second aspect of the present invention, a method is provided for locating wire pairs in a group wiring system. The group wiring system comprises a hub of a server system, a distribution frame electrically connected to the hub, the distribution frame including, a plurality of wire pair receptacles, each wire pair receptacle including at least two contacts each connecting with a conductive wire, a plurality of remote receptacles electrically connected to the distribution frame and respectively in association with the wire pair receptacles of the distribution frame, a testing device electrically connected to the remote receptacles, and a plurality of testing circuits. Each testing circuit is coupled between the conductive wires of the contacts of an associated one of the wire pair receptacles. Each testing circuit comprises a light emitting means and a filtering means.

The method comprises applying a testing voltage by the testing device to the contacts to cause an associated one of the light emitting means to emit light. The testing voltage is a low-frequency voltage signal having a frequency higher than 200 Hz that creates a circuit impedance higher than an impedance of the filtering means when passing through the hub, thereby decaying and filtering the low-frequency voltage signal and allowing locating test while the server system is on-line.

Preferably, the testing device is an oscillating circuit and includes a power source. The oscillating circuit outputs the low-frequency voltage signal.

Preferably, the frequency of the low-frequency voltage signal is in a range between 100 KHz and 3 MHz.

Other objectives, advantages, and novel features of the invention will become more apparent from the following detailed description when taken in conjunction with the accompanying drawings.

DETAILED DESCRIPTION OF THE INVENTION

Figure 1:
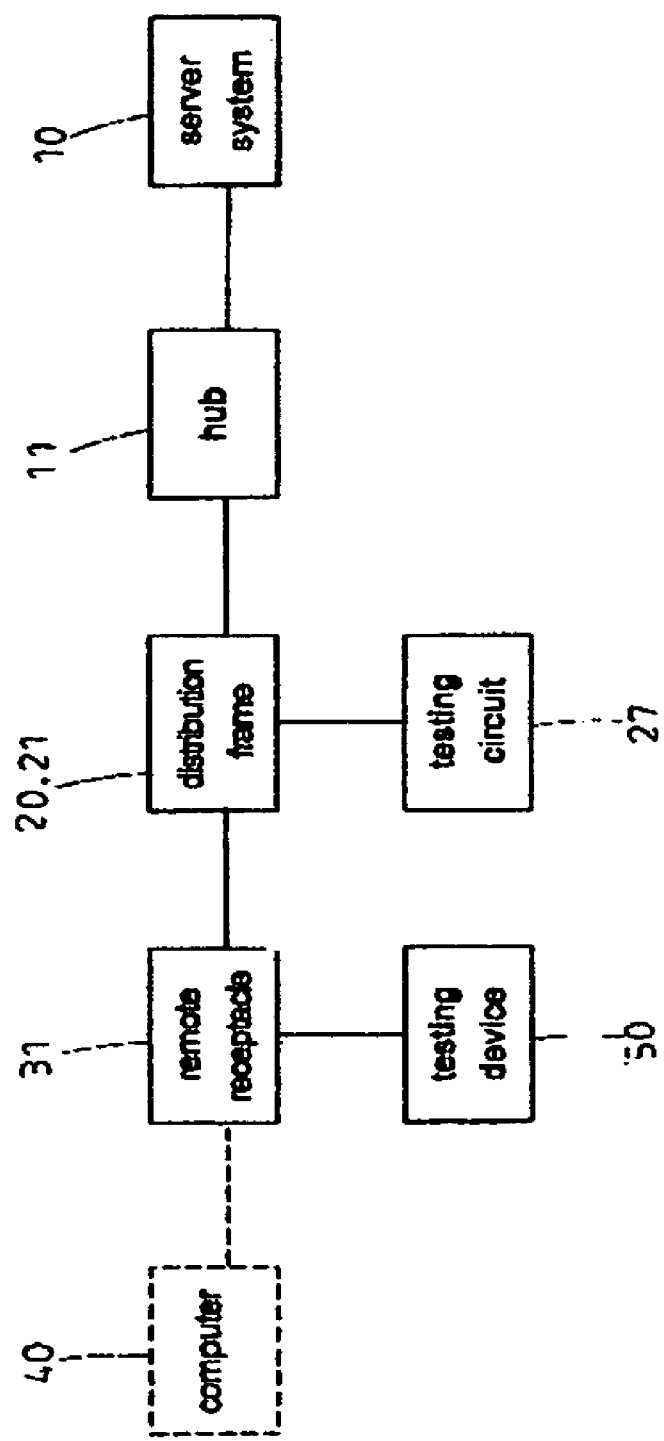
FIG. 1 is a schematic block diagram illustrating a group wiring system in accordance with the present invention.
Figure 2:
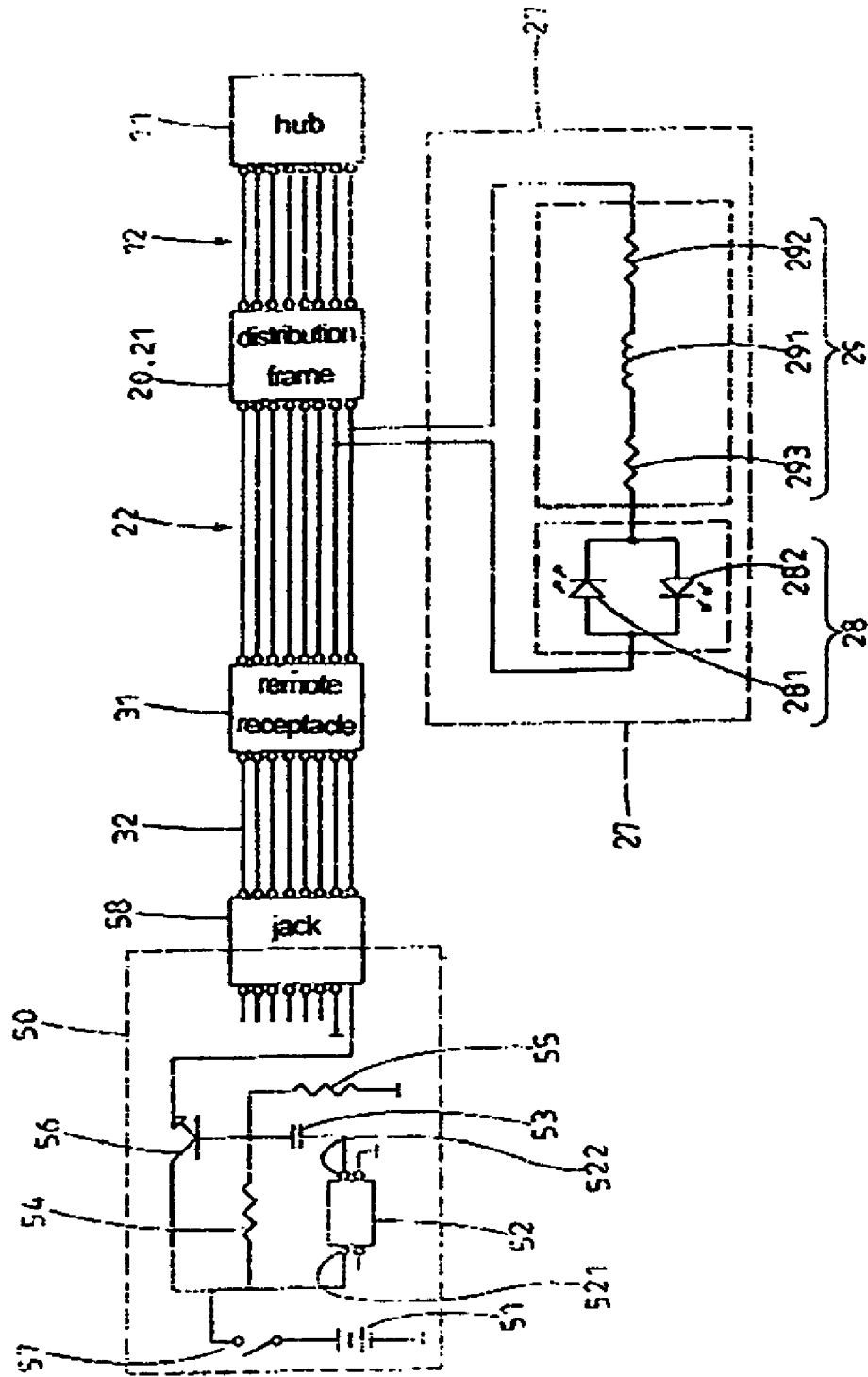
FIG. 2 is a schematic diagram illustrating the circuitry of the group wiring system in FIG. 1.

Referring to FIGS. 1 and 2, a group wiring system in accordance with the present invention comprises a hub 11, a distribution frame 20 electrically connected to the hub 11, a plurality of remote receptacles 31, and a testing device 50. The hub 11 may be a hub of a server system 10. The distribution frame 20 includes a plurality of wire pair receptacles 21 respectively in association with the remote receptacles 31. The hub 11 is connected to the distribution frame 20 via jump wires 12 for networks. Each wire pair receptacle 21 is connected via a conductive wire 22 (such as a network cable) to an associated one of the remote receptacles 31. Each remote receptacle 31 is normally connected to a computer 40 in a working area via jump wires 12 for networks. Further, each remote receptacle 31 is connected to the testing device 50 during testing of wire pair locations.

Figure 3:
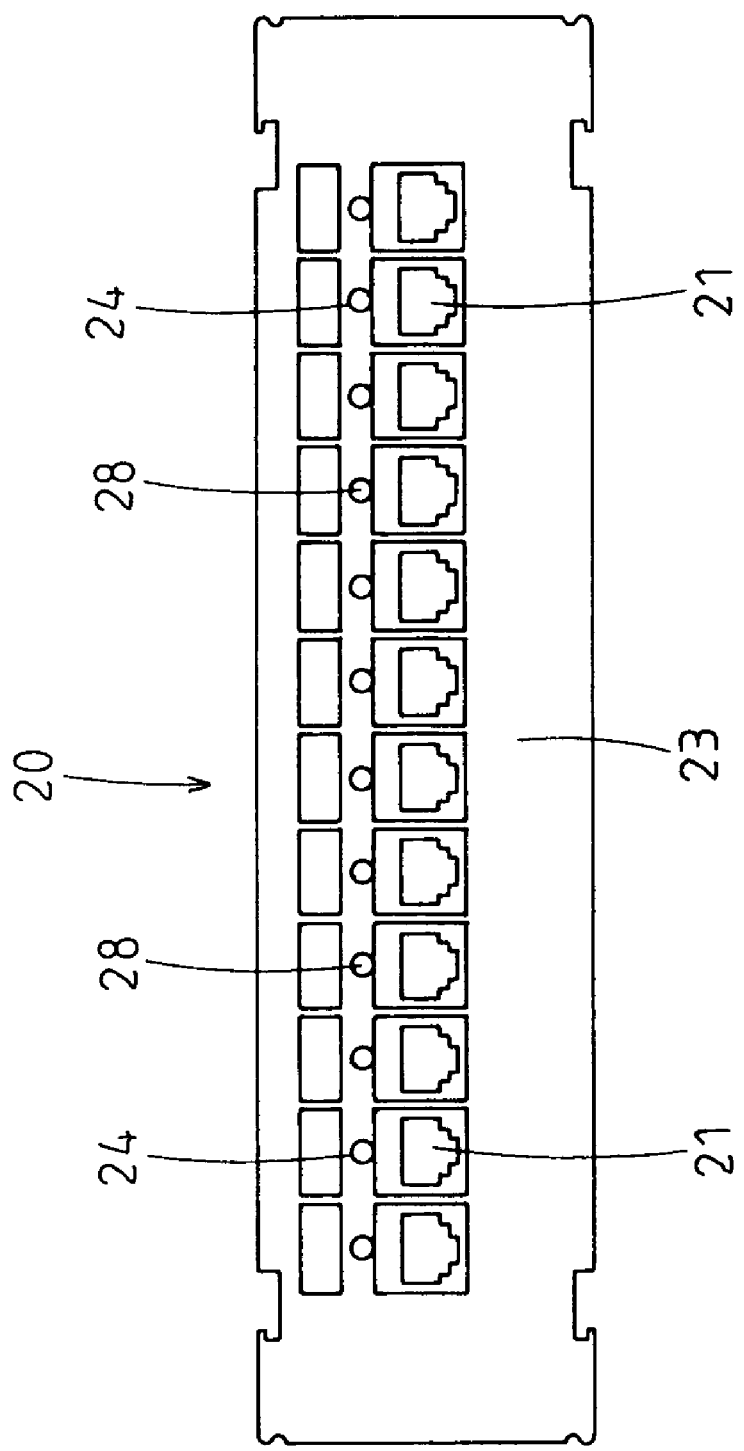
FIG. 3 is a schematic plan view of a distribution frame in FIG. 2.

Referring to FIG. 3, the distribution frame 20 includes a panel 23 to which the wire pair receptacles 21 are mounted. Each wire pair receptacle 21 is connected to an associated one of testing circuits 27 (see FIGS. 2 and 4) on a circuit board (not shown) of the distribution frame 20.

Figure 4:
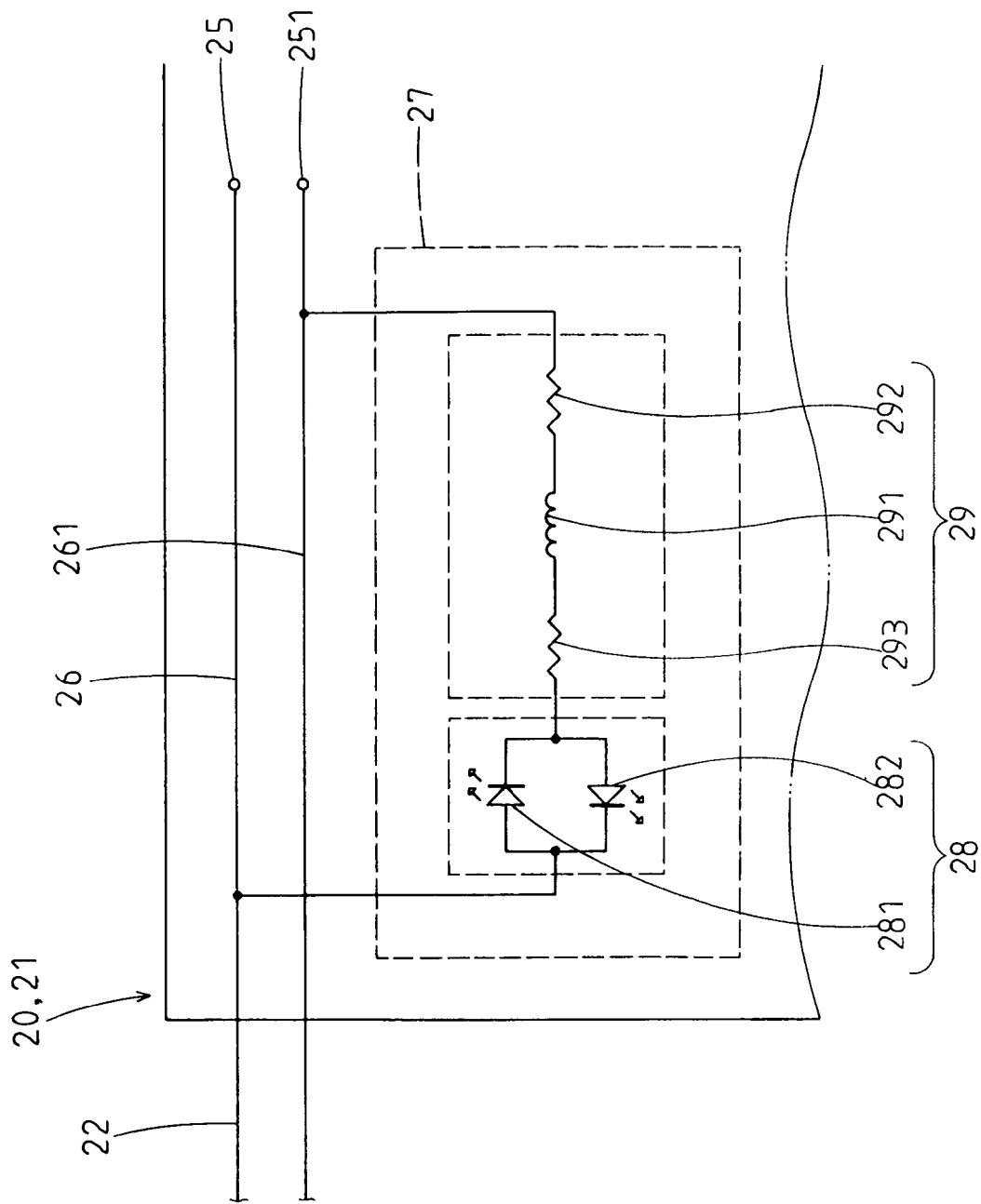
FIG. 4 is a diagram illustrating a testing circuit of the group wiring system in FIG. 1.

Referring to FIG. 4, each wire pair receptacle 21 includes at least two contacts 25 and 251. Each contact 25, 251 is connected to a conductive wire 26, 261. Each testing circuit 27 is coupled between two conductive wires 26 and 261 of an associated wire pair receptacle 21. Each testing circuit 27 further includes a light emitting means 28 and a filtering means 29. The light emitting means 28 emits light when a testing voltage is applied to the testing circuit 27. The filtering means 29 is connected in series between the testing circuit 27 and the light emitting means 28. The filtering means 29 can minimize or even eliminate loop back shorting caused by the testing circuit 27 when a communication frequency signal or a low-voltage signal is applied. In a preferred embodiment, the light emitting means 28 includes light-emitting diodes 281 and 282, and the filtering means 29 includes a filter 291 and two resistors 292 and 293 connected to the filter 291 in series.

Referring to FIG. 3, the panel 23 includes a plurality of light holes 24 located corresponding to the light emitting means 28 such that the light emitted from the light emitting means 28 may reach outside via the light holes 24.

Referring to FIG. 2, the testing device 50 is an oscillating circuit and includes a power source 51. The power source 51 outputs via a switch 57 such that an oscillation signal is output by Clock 522 after Vcc 521 is supplied to a quartz crystal oscillator 52. This oscillation signal passes through a capacitor 53 and added to a bias consisting of two resistors 54 and 55 and then input into a NPN transistor 56. The voltage signal is input to the base (not labeled) of the transistor 56 to control on and off of the collector (not labeled) and the emitter (not labeled) of the transistor 56. In a preferred embodiment, a signal having a frequency of 1 MHz input to the base causes on and off at the frequency of 1 MHz. The LEDs 281 and 282 of the associated wire pair receptacles 21 are turned on by providing sufficient electric current and voltage through the NPN transistor 56. In conclusion, testing voltage applied by the testing device 50 passes through a jack 58, network jump wires 32, and the remote receptacles 31 to apply a low voltage signal to the testing circuit 27 for the associated wire pair receptacles 21 thereby making the LEDs 281 and 282 of the associated wire pair receptacles 21 emit light for wire pair identification purposes.

In this embodiment, the frequency of the low-frequency voltage signal must be higher than 200 Hz, preferably in a range between 100 KHz and 3 MHz. For example, if the frequency of the voltage signal is 1 MHz, the LEDs 281 and 282 are turned on and off at a frequency not perceivable to the eyes of an observer such that the LEDs 281 and 282 seem always on to the observer. The brightness of the LEDs 281 and 282 is in proportion to the frequency of the low-frequency voltage signal, and the LEDs 281 and 282 are brightest when the frequency is increased to 1 MHz. Nevertheless, further increase in frequency causes reduction in the brightness of the LEDs 281 and 282. Further, when the low-frequency voltage signal (having a frequency of, e.g., 1 MHz) is passing through a transformer (not shown) in the hub 11, the created circuit impedance is higher than the impedance of the filtering means 29 for decaying and filtering the low-frequency voltage signal, preventing short circuit of the wire pairs and assuring normal operation of the light emitting means 28. Thus, the low-frequency voltage signal can be used to proceed with wire pair identification even though the server system 10 is on-line. Namely, detachment or disconnection of the server system 1 is not required.

In a case that a low-frequency voltage signal having a frequency below 200 Hz is input to the transformer in the hub 11, the circuit impedance will be too low and thus cause short circuit, leading to abnormal operation of the light emitting means 28.

The inductance of the transformer of a 10/100/1000 Mbps Switch type hub is about 350 µH to allow significant decay of the low-frequency voltage signal having a frequency higher than 200 Hz after passing through the transformer. Nevertheless, decay of this low-frequency voltage signal is smaller after passing through the low-inductance filter 291 and resistors 292 and 293. Thus, the light emitting means 28 can be activated to emit light.

Currently available hubs include (1) IEEE802.3/IEEE802.3u10/100 Base-Tx Ethernet/Fast Ethernet, (2) IEEE802.3ab1000 Base-T Gigabit Ethernet, and (3) IEEE802.3af POE.

In the first type of hubs, 12/36 wire pairs are used to transmit information. The signal is input to an IC in the hub after filtering as a result of passing through a transformer. Generally, the 4/5 and 7/8 wire pairs are short-circuited, connected in series with resistor(s), and grounded by capacitor(s).

In the second type of hubs, the 12/36/45/78 wire pairs are used to transmit information. The signal is input to an IC in the hub after filtering as a resulting of passing through a transformer.

In the third type of hubs, 12/36 wire pairs are used to transmit information. The signal is input to an IC in the hub after filtering as a result of passing through a transformer. Generally, the 4/5 wire pairs is short-circuited and then grounded, and the 7/8 wire pairs are short-circuited and then used to convey a power of 48 VDC.

The above-mentioned low-frequency voltage signal having a frequency higher than 200 Hz is preferably applied to a half of the wire pairs of the network cables of the above-mentioned products to avoid short circuit. In a case that products of other types are used, suitable combination of the wire pairs can be selected, allowing convenient use of this technique and allowing application on future upgraded products.

Although a specific embodiment has been illustrated and described, numerous modifications and variations are still possible without departing from the essence of the invention. The scope of the invention is limited by the accompanying claims.

What is claimed is:

1. A group wiring system comprising:
    a hub of a server system;
    a distribution frame electrically connected to the hub, the distribution frame including a plurality of wire pair receptacles, each said wire pair receptacle including at least two contacts each connecting with a conductive wire;
    a plurality of remote receptacles electrically connected to the distribution frame and respectively in association with the wire pair receptacles of the distribution frame;
    a testing device electrically connected to the remote receptacles; and
    a plurality of testing circuits, each said testing circuit being coupled between said conductive wires of said contacts of an associated one of the wire pair receptacles, each said testing circuit comprising a light emitting means and a filtering means;
    the light emitting means emitting light when the testing device applies a testing voltage to said contacts, the testing voltage being a low-frequency voltage signal having a frequency in a range between 100 KHz and 3 MHz that creates a circuit impedance higher than an impedance of the filtering means when passing through the hub, thereby decaying and filtering the low-frequency voltage signal and allowing locating test while the server system is on-line.

2. The group wiring system as claimed in claim 1, with the testing device being an oscillating circuit and including a power source, and with the oscillating circuit outputting the low-frequency voltage signal.

3. A method for locating wire pairs in a group wiring system, the group wiring system comprising:
    a hub of a server system;
    a distribution frame electrically connected to the hub, the distribution frame including a plurality of wire pair receptacles, each said wire pair receptacle including at least two contacts each connecting with a conductive wire;
    a plurality of remote receptacles electrically connected to the distribution frame and respectively in association with the wire pair receptacles of the distribution frame;
    a testing device electrically connected to the remote receptacles; and
    a plurality of testing circuits, each said testing circuit being coupled between said conductive wires of said contacts of an associated one of the wire pair receptacles, each said testing circuit comprising a light emitting means and a filtering means;
    the method comprising:
    applying a testing voltage by the testing device to said contacts to cause an associated one of the light emitting means to emit light, the testing voltage being a low-frequency voltage signal having a frequency in a range between 100 KHz and 3 MHz that creates a circuit impedance higher than an impedance of the filtering means when passing through the hub, thereby decaying and filtering the low-frequency voltage signal and allowing locating test while the server system is on-line.

4. The method as claimed in claim 3, with the testing device being an oscillating circuit and including a power source, and with the oscillating circuit outputting the low-frequency voltage signal.

* * * * *